Figure 1:
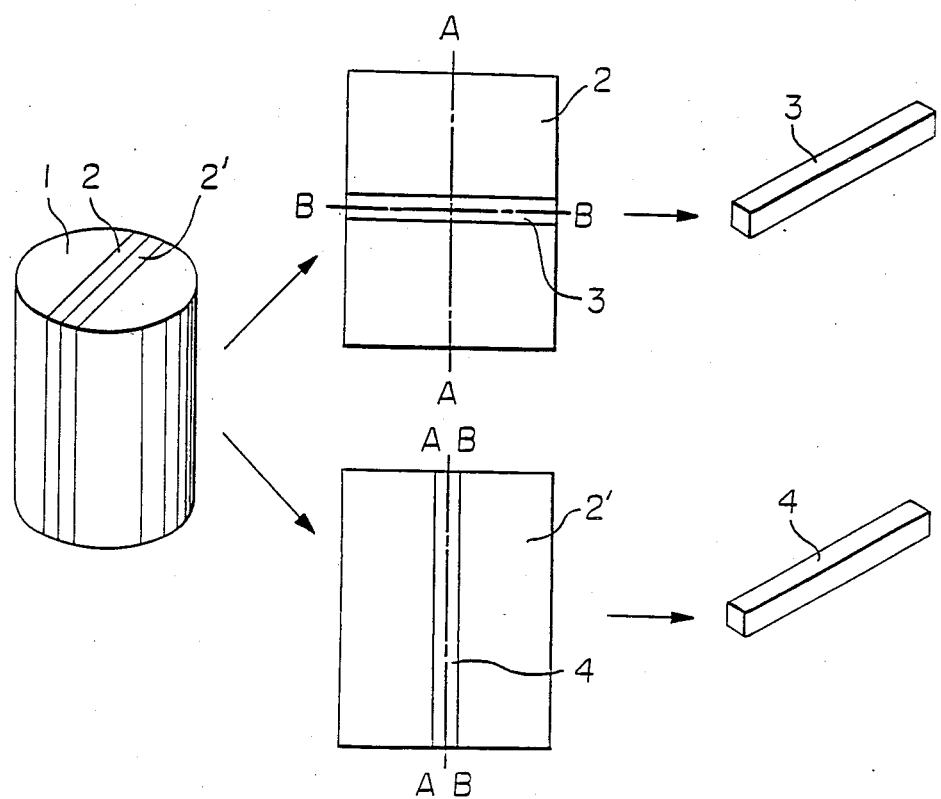

United States Patent [19]

Nishikawa et al.

[11] Patent Number: 4,795,723
[45] Date of Patent: Jan. 3, 1989

[54] ELECTRICALLY CONDUCTIVE CERAMIC PRODUCT AND PROCESS FOR ITS PRODUCTION

[75] Inventors: Hiroshi Nishikawa; Koichi Matsuda; Masami Nakashima, all of Omuta, Japan

[73] Assignee: Denki Kagaku Kogyo Kabushiki Kaisha, Tokyo, Japan

[21] Appl. No.: 16,366

[22] Filed: Feb. 19, 1987

[30] Foreign Application Priority Data

Feb. 27, 1986 [JP] Japan .................................. 61-40317

[51] Int. Cl.$^4$ .............................................. C04B 35/58
[52] U.S. Cl. ..................................... 501/98; 252/520; 264/65
[58] Field of Search .................... 501/96, 98; 252/520; 264/65, 66

[56] References Cited

U.S. PATENT DOCUMENTS

| | | | |
|---|---|---|---|
| 3,544,486 | 12/1970 | Passmore | 501/96 X |
| 3,649,314 | 3/1972 | James | 501/96 |
| 3,803,707 | 4/1974 | Passmore et al. | 29/611 |
| 3,813,252 | 5/1974 | Lipp | 501/87 X |
| 4,008,183 | 2/1977 | Ishii et al. | |
| 4,514,355 | 4/1985 | Montgomery | 501/96 X |

FOREIGN PATENT DOCUMENTS

| | | | |
|---|---|---|---|
| 131884 | 1/1985 | European Pat. Off. | 501/96 |
| 2536367 | 2/1976 | Fed. Rep. of Germany | 501/96 |
| 55-8586 | 3/1980 | Japan . | |
| 58-2260 | 1/1983 | Japan . | |
| 1160755 | 8/1969 | United Kingdom . | |
| 1251664 | 10/1971 | United Kingdom | 501/96 |
| 1285211 | 8/1972 | United Kingdom . | |
| 1434136 | 5/1976 | United Kingdom . | |
| 2065713 | 7/1981 | United Kingdom . | |
| 2173814 | 10/1986 | United Kingdom . | |

Primary Examiner—Mark L. Bell
Assistant Examiner—Ann M. Knab
Attorney, Agent, or Firm—Oblon, Fisher, Spivak, McClelland & Maier

[57] ABSTRACT

An electrically conductive hot press sintered ceramic product comprising boron nitride, titanium diboride and aluminum nitride and having a flexural strength of at least 900 kg/cm$^2$, a specific resistance of from 300 to less than 2,500 $\mu\Omega$cm and less anisotropy.

9 Claims, 1 Drawing Sheet

ELECTRICALLY CONDUCTIVE CERAMIC PRODUCT AND PROCESS FOR ITS PRODUCTION

The present invention relates to an electrically conductive hot press sintered ceramic product comprising boron nitride, titanium diboride and aluminum nitride and having less anisotropy.

In recent years, electrically conductive ceramic products have been widely used as resistance heating elements useful at high temperatures. In particular, electrically conductive ceramic products composed essentially of boron nitride, titanium diboride and aluminum nitride, have been used as resistance heating type evaporators for vapor deposition, instead of high melting point metal evaporators made of tungsten or molybdenum, because such electrically conductive ceramic products have excellent corrosion resistance and long useful life.

Such electrically conductive ceramic products composed essentially of boron nitride, titanium diboride and aluminum nitride, are produced by hot press sintering. However, conventional sintered products have substantial anisotropy, whereby there is a substantial difference of a level of at least twice in the mechanical strength or in the thermal shock resistance as between the hot-pressed direction i.e. the axial direction of hot pressing and the direction perpendicular to the hot-pressed direction. Accordingly, when an evaporating boat is prepared from an electrically conductive hot press sintered ceramic product, it has been common to machine or cut out the evaporating boat from the ceramic product in a certain specific direction of the product, as disclosed in Japanese examined patent publication No. 8586/1980 or U.S. Pat. No. 3,803,707.

However, depending upon the shape or the size of a desired evaporating boat, it may be difficult to machine it from the hot press sintered product in such a specific direction, and there will be problems such that the machined product is inferior in the thermal shock resistance, the yield is poor because of the limitation in the direction of machining, or the working efficiency is poor. Under the circumstances, an inexpensive electrically conductive ceramic material having less anisotropy has been desired.

It is an object of the present invention to provide an electrically conductive ceramic product comprising boron nitride, titanium diboride and aluminum nitride and having less anisotropy, by hot press sintering.

The present inventors have conducted extensive researches to accomplish the above object, and have found that the difference in the crystallinity of boron nitride as starting material for hot press sintering largely affects the anisotropy of the hot press sintered product. The present invention has been accomplished on the basis of this discovery.

According to the first aspect, the present invention provides an electrically conductive hot press sintered ceramic product comprising boron nitride, titanium diboride and aluminum nitride and having a flexural strength of at least 900 kg/cm$^2$, a specific resistance of from 300 to less than 2,500 $\mu\Omega$cm and less anisotropy.

According to the second aspect, the present invention provides a process for producing an electrically conductive ceramic product having a flexural strength of at least 900 kg/cm$^2$, a specific resistance of from 300 to less than 2,500 $\mu\Omega$cm and less anisotropy, which comprises hot press sintering a powder mixture comprising from 20 to 50% by weight of turbostratic boron nitride, from 1 to 15% by weight of aluminum and/or aluminum nitride, the rest being titanium diboride, under a non-oxidative atmosphere at a temperature of from 1,900° to 2,150° C. under a pressure of from 50 to 350 kg/cm$^2$.

Now, the present invention will be described in detail with reference to the preferred embodiments.

In the accompanying drawings, FIG. 1 is a diagramatical view illustrating a manner for cutting out a material for an electrically conductive ceramic evaporating boat from a hot press sintered electrically conductive ceramic product.

In FIG. 1, reference numeral 1 designates a hot press sintered electrically conductive ceramic product, numerals 2 and 2' indicate sheet-like materials, numeral 3 designates a rod-like material cut out in the direction at 90° relative to the axial direction of pressing, numeral 4 designates a rod-like material cut out in the direction parallel to the axial direction of pressing, line A—A indicates the axial direction of pressing, and line B—B indicates the direction for cutting out the material.

Firstly, referring to the first aspect of the present invention, the electrically conductive ceramic product of the invention comprises boron nitride, titanium diboride and aluminum nitride. The preferred proportions of the respective components, are from 20 to 50% by weight of boron nitride, from 35 to 79% by weight of titanium diboride and from 1 to 15% by weight of aluminum nitride. Boron nitride is a component which serves to improve the thermal shock resistance. If the amount is less than 20% by weight, the effect can not adequately be obtained. On the other hand, if the amount exceeds 50% by weight, there will be a problem such that the electrical conductivity tends to be too low, or the mechanical strength tends to be low. Titanium diboride is an important component which governs the electrical conductivity, and the specific resistance will be influenced by its content. Aluminum nitride is a component responsible for the mechanical strength. If the amount is less than 1% by weight, the strength will be inadequate, and if it exceeds 15% by weight, the strength tends to be so high that the machinability tends to be poor.

The electrically conductive ceramic product of the present invention is produced by hot press sintering, and the preferred conditions for the hot press sintering will be described hereinafter. The feature of the present invention resides in that the hot press sintered product has less anisotropy. The "anisotropy" is a characteristic in which the physical properties such as the flexural strength or the electrical conductivity, differ depending upon the direction of the electrically conductive ceramic product, and the "less" means that the anisotropy is less than the anisotropy of the conventional hot press sintered electrically conductive ceramic products. For example, in the case of the ratio of the specific resistance in the hot-pressed direction to the specific resistance in the direction perpendicular to the hot-pressed direction, the "less anisotropy" means that the ratio is less than the conventional level of about 2. Namely, such a ratio in the specific resistance is usually less than 1.9, preferably less than 1.4, more preferably less than 1.2.

The flexural strength of the electrically conductive ceramic product of the present invention is at least 900 kg/cm$^2$, preferably at least 1,000 kg/cm$^2$. It is known that the thermal shock resistance of a ceramic product is generally interrelated with the flexural strength when the product is composed of the same component. Thus, if the flexural strength is less than 900 kg/cm², the thermal shock resistance is usually so low that it is inadequate for an electrically conductive ceramic product.

The specific resistance of the electrically conductive ceramic product of the present invention is within a range of from 300 to less than 2,500 $\mu\Omega$cm. If the specific resistance is less than 300 $\mu\Omega$cm, a large electric current flows, whereby if it is used for an evaporating boat, its useful life is very short. On the other hand, if the specific resistance is 2,500 $\mu\Omega$cm or higher, the electrical heating will be difficult.

Now, the second aspect of the present invention will be described. The feature of the process of the present invention resides in that boron nitride having a turbostratic crystal structure is used as the boron nitride powder. The hot press sintering is conducted usually by means of a hot press apparatus of monoaxial pressing type. Usual boron nitride wherein the hexagonal crystal structure is completely established and stabilized, has a scaly or flaky particle shape grown to have a crystal size $L_c$ of at least 500 Å, and when hot-pressed, the crystals are oriented in a plane perpendicular to the axial direction of pressing. Thus, a hot press sintered electrically conductive ceramic product composed essentially of usual boron nitride wherein the hexagonal crystal structure of boron nitride is completely established, titanium diboride and aluminum nitride, has anisotropy due to this orientation. Whereas, in the present invention, turbostratic boron nitride is used, whereby there will be no orientation relative to the direction of pressing during the hot press sintering, and it is possible to obtain an electrically conductive ceramic product having less anisotropy.

The turbostatic boron nitride can be obtained by conducting a conventional reaction for the synthesis of boron nitride at a temperature lower than the temperature (about 1,400°–1,800° C.) for the formation of the hexagonal crystal lattice, such as a method wherein boric anhydride and dicyandiamide are reacted at a low temperature of not higher than 1,300° C. under a nitrogen atmosphere, and the reaction product is washed to remove products other than boron nitride, or a method wherein borax and urea are subjected to heat treatment at a low temperature of about 800° C. in an ammonia gas stream. This turbostratic boron nitride is added in an amount of from 20 to 50% by weight in the starting material for the hot press sintering. If the amount is less than 20% by weight, the thermal shock resistance tends to be low, and the machinability of the sintered product will be poor. On the other hand, if the amount exceeds 50% by weight, the specific resistance of the molded product thus obtained will be high so that it will be difficult to heat the molded product by direct application of an electric current to the molded product.

Aluminum and aluminum nitride serve as a component to facilitate densification. In particular, aluminum reacts boron nitride at a high temperature during the hot pressing to form aluminum nitride and boron.

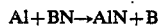

This boron will react with aluminum in the starting material to form an Al-B alloy or aluminum boride as the fourth component which firmly binds aluminum nitride, boron nitride and titanium boride, whereby the strength of the molded product is improved, and the thermal shock resistance will be improved. If the amount of the aluminum and/or aluminum nitride is less than 1% by weight, no adequate densification will be obtained even when hot press sintered, and the strength and the thermal shock resistance will be inadequate. On the other hand, if the amount exceeds 15% by weight, the hardness tends to be so high that the machinability tends to be poor. When aluminum is used, the fourth component tends to be excessive, whereby the product tends to undergo softening and deformation when used at high temperatures. A preferred amount of the aluminum is from 3 to 8% by weight, and a preferred amount of aluminum nitride is from 5 to 12% by weight. When aluminum nitride and aluminum are used in combination, the total amount is preferably from 3 to 8% by weight as calculated as aluminum.

Titanium boride is a component responsible for the electrical conductivity of the ceramic product, and constitutes the rest of the above components. It is incorporated in an amount such that the specific resistance of the final ceramic product at room temperature will be from 300 to less than 2,500 $\mu\Omega$cm.

If the hot press sintering temperature is less than 1,900° C., the reaction of boron nitride and aluminum and the stability will be inadequate, whereby there will be problems such that a gas is likely to be generated when used at a high temperature, or cracking is likely to result. Further, the densification will be inadequate, whereby the strength will be low. On the other hand, if the temperature exceeds 2,150° C., boron nitride tends to undergo thermal decomposition, and the reaction of the molded product with graphite mold will be remarkable, such being undesirable. The temperature is preferably from 2,000° to 2,100° C.

If the hot pressing pressure is less than 50 kg/cm², the porosity will be high, whereby the strength of the product will be poor. On the other hand, if the pressure exceeds 350 kg/cm², the graphite mold is likely to break. The pressure is preferably from 100 to 200 kg/cm².

The non-oxidative atmosphere may be under a vacuumed condition, or an inert gas atmosphere such as an argon or nitrogen atmosphere, or a reducible atmosphere such as a carbon monoxide or hydrogen atmosphere. If the hot press sintering is conducted under an oxidative atmosphere, the constituents for the electrically conductive ceramic product such as titanium diboride and aluminum nitride will be oxidized, whereby it is hardly possible to obtain an electrically conductive ceramic product having the desired properties.

Now, the present invention will be described in further detail with reference to Examples and Comparative Examples. However, it should be understood that the present invention is by no means restricted to these specific Examples.

EXAMPLE 1 and COMPARATIVE EXAMPLE 1

Boric anhydride and dicyandiamide were reacted at 1,200° C. under a nitrogen atmosphere, and the reaction product was washed with dilute nitric acid to obtain turbostratic boron nitride.

Then, 30% by weight of the turbostratic boron nitride powder (hereinafter referred to simply as "BN") thus obtained, 8% by weight of aluminum powder (Al (At)-250 mesh, manufactured by Fukuda Kinzokuhakufun K.K.) and 62% by weight of titanium boride powder (Vacuum Grade, manufactured by Hermanschutal Co., hereinafter referred to simply as "TiB₂") were thoroughly mixed in a vibration ballmill (using alumina balls) for 20 minutes. The mixture was filled in a cylindrical graphite mold, and graphite pushing rods were inserted from the top and the bottom of the graphite mold for pressing. Then, hot press sintering was conducted at a temperature of 2,000° C. under a pressure of 200 kg/cm² under an argon atmosphere.

As Comparative Example 1, a hot press sintered product was obtained in the same manner as above except that commercially available BN having a hexagonal crystal structure (Denkaboron Nitride GP, tradename, manufactured by Denki Kagaku Kogyo Kabushiki Kaisha) was used instead of the turbostratic BN.

The hot press sintered products had a size of 170 mm in diameter and 120 mm in length.

As shown in FIG. 1, from each of these hot press sintered products 1, sheet-like materials 2 and 2' with a width of 7 mm were cut out in parallel with the axial direction of pressing. Further, two types of rod-like materials 3 and 4 with a width of 7 mm and a thickness of 5 mm were cut out each with a width of 5 mm in the direction at 90° relative to the axial direction of pressing (designated by "⊥") and in the direction parallel to the axial direction of pressing (designated by "//"). From these materials, electrically conductive ceramic evaporating boats were prepared, respectively. The electrically conductive ceramic evaporating boats had a size of 110 mm in length, 6 mm in width and 4 mm in thickness and provided at its center with a cavity of 40 mm in length, 4 mm in width and 2 mm in depth.

Each electrically conductive ceramic evaporating boat was mounted on a resistance heating type vacuum deposition apparatus, and evaporation of aluminum was conducted. The evaporating time for one operation was set to be 30 seconds, and the vacuum deposition operation was repeated until cracking was observed in the electrically conductive ceramic evaporating boat, whereby the number of repeated operations was counted.

The results and the physical properties of the electrically conductive ceramic products are shown in Table 1.

The specific resistance was measured by a four terminal system by means of a resistance meter in the direction parallel to the axial direction of pressing (⊥) and in the direction perpendicular to the axial direction of pressing (//) for each electrically conductive ceramic evaporating boat. Regardless of the direction in which the electrically conductive ceramic evaporating boat was taken, the specific resistance in the ⊥ or // direction relative to the axial direction of pressing does not change. Therefore, the results of the measurement of the specific resistance in the ⊥ and // directions, respectively, were represented by the values measured in the direction in which the electric current was applied to the electrically conductive ceramic evaporating boat (i.e. to the longitudinal direction of the boat).

The flexural strength was measured by the three point flexural strength measuring method in accordance with JIS R1601.

TABLE 1

|  | Cutting out direction | Specific resistance (μΩcm) | Flexural strength (kg/cm²) | Useful life of the boat (number of repeated times) |
|---|---|---|---|---|
| Example 1 | ⊥ | 646 | 1,350 | At least 500 |
|  |  | 711 | 1,250 | At least 500 |
| Comparative Example 1 | ⊥ | 608 | 1,320 | At least 500 |
|  |  | 1,167 | 770 | 45 |

EXAMPLES 2 to 11 and COMPARATIVE EXAMPLES 2 to 5

Hot press sintering was conducted in the same manner as in Example 1 except that the same turbostatic BN as used in Example 1, Al and TiB₂, and aluminum nitride (200 mesh pass, manufactured by Hermanschutalk Co.; hereinafter referred to simply as "AlN") were mixed in the proportions as identified in Table 2.

Each electrically conductive ceramic product thus obtained was processed into an evaporating boat in the same manner as in Example 1, and the useful life of the boat for the evaporation of aluminum was measured in a vacuum evaporation apparatus.

The results and the physical properties of the electrically conductive ceramic products are shown in Table 2.

TABLE 2

|  |  | Proportions (% by weight) | | | | Cutting out direction | Specific resistance (μΩcm) | Flexural strength (kg/cm²) | Useful life of the boat (number of repeated times) |
|---|---|---|---|---|---|---|---|---|---|
|  |  | BN | Al | AlN | TiB₂ |  |  |  |  |
| EXAMPLES | 2 | 45 | 8 | 0 | 47 | ⊥ | 1,700 | 1,300 | At least 500 |
|  |  |  |  |  |  |  | 1,950 | 1,250 | " |
|  | 3 | 20 | 8 | 0 | 72 | ⊥ | 301 | 1,350 | 500 |
|  |  |  |  |  |  |  | 336 | 1,245 | " |
|  | 4 | 30 | 3 | 0 | 67 | ⊥ | 512 | 1,100 | 440 |
|  |  |  |  |  |  |  | 566 | 1,085 | 400 |
|  | 5 | 30 | 14 | 0 | 56 | ⊥ | 814 | 1,590 | At least 500 |
|  |  |  |  |  |  |  | 883 | 1,485 | " |
|  | 6 | 30 | 1 | 0 | 69 | ⊥ | 470 | 955 | 200 |
|  |  |  |  |  |  |  | 530 | 930 | 184 |
|  | 7 | 30 | 3 | 7 | 60 | ⊥ | 660 | 1,280 | At least 500 |
|  |  |  |  |  |  |  | 715 | 1,220 | " |
|  | 8 | 30 | 0 | 5 | 65 | ⊥ | 550 | 1,080 | 412 |
|  |  |  |  |  |  |  | 590 | 1,040 | 381 |
|  | 9 | 30 | 0 | 15 | 55 | ⊥ | 830 | 1,410 | 500 |
|  |  |  |  |  |  |  | 890 | 1,350 | " |
|  | 10 | 45 | 0 | 12 | 43 | ⊥ | 2,100 | 1,350 | At least 500 |
|  |  |  |  |  |  |  | 2,320 | 1,280 | " |
|  | 11 | 20 | 2 | 10 | 68 | ⊥ | 390 | 1,300 | 450 |
|  |  |  |  |  |  |  | 540 | 930 | 200 |
| COMPARA- | 2 | 60 | 8 | 0 | 32 | ⊥ | 150,000 | 1,420 | Electrical |

TABLE 2-continued

| | | Proportions (% by weight) | | | | Cutting out direction | Specific resistance ($\mu\Omega$cm) | Flexural strength (kg/cm$^2$) | Useful life of the boat (number of repeated times) |
|---|---|---|---|---|---|---|---|---|---|
| | | BN | Al | AlN | TiB$_2$ | | | | |
| TIVE EXAMPLES | | | | | | | 190,000 | 1,210 | heating impossible |
| | 3 | 10 | 14 | 0 | 76 | $\perp$ | 250 | 1,610 | 5 |
| | | | | | | | 259 | 1,470 | 3 |
| | 4 | 50 | 0 | 0 | 50 | $\perp$ | 1,040 | 600 | 2 |
| | | | | | | | 1,130 | 520 | 2 |
| | 5 | 30 | 20 | 10 | 40 | $\perp$ | 2,500 | 1,680 | Volatile substances too much for practical use |
| | | | | | | | 2,900 | 1,570 | |

EXAMPLES 12 to 14 and COMPARATIVE EXAMPLES 6 to 8

By using the same composition of the starting materials and the same mixing condition as in Example 1, hot press sintering was conducted under the temperature and pressure conditions as identified in Table 3. Electrically conductive ceramic evaporating boats having the same shape as in Example 1 were prepared, and the useful life of each evaporating boat was evaluated in the same manner. The results are shown in Table 3 together with the physical properties of the electrically conductive ceramic products. In Table 3, the results of Example 1 are also shown.

TABLE 3

| | | Temperature (°C.) | Pressure (kg/cm$^2$) | Cutting out direction | Specific resistance ($\mu\Omega$cm) | Flexural strength (kg/cm$^2$) | Useful life of the boat (number of repeated times) |
|---|---|---|---|---|---|---|---|
| EXAMPLES | 12 | 1,900 | 200 | $\perp$ | 750 | 1,200 | At least 500 |
| | | | | | 705 | 1,150 | 490 |
| | 1 | 2,000 | 200 | $\perp$ | 646 | 1,350 | At least 500 |
| | | | | | 711 | 1,250 | " |
| | 13 | 2,100 | 200 | $\perp$ | 550 | 1,320 | At least 500 |
| | | | | | 640 | 1,180 | " |
| | 14 | 2,000 | 100 | $\perp$ | 810 | 1,120 | 450 |
| | | | | | 847 | 1,080 | 400 |
| COMPARATIVE EXAMPLES | 6 | 1,800 | 200 | $\perp$ | 1,160 | 700 | 3 |
| | | | | | 1,310 | 650 | 1 |
| | 7 | 2,000 | 20 | $\perp$ | 1,200 | 600 | 1 |
| | | | | | 1,180 | 600 | 1 |
| | 8 | 2,200 | 200 | $\perp$ | 550 | 850 | 10 |
| | | | | | 780 | 620 | 1 |

According to the present invention, it is possible to obtain an electrically conductive ceramic product having less anisotropy simply by hot press sintering without using a sophisticated sintering method such as hot isotactic pressing (HIP). Therefore, a resistance heating element having excellent properties can be obtained even when the machining direction is freely chosen.

We claim:

1. An electrically conductive hot press sintered ceramic product comprising from 20 to 50% by weight of boron nitride, from 35 to 79% by weight of titanium diboride and from 1 to 15% by weight of aluminum nitride, said ceramic product having a flexural strength of at least 900 kg/cm$^2$, a specific resistance of from 300 to less than 2,500 $\mu\Omega$cm, and a reduced anisotropy such that the ratio of the specific resistance in the hot-pressed direction to the specific resistance in the direction perpendicular to the hot-pressed direction is less than 1.4.

2. The ceramic product according to claim 1 wherein the ratio of the specific resistance in the hot-pressed direction to the specific resistance in the direction perpendicular to the hot-pressed direction is less than 1.2.

3. The ceramic product according to claim 1, wherein the flexural strength is at least 1,000 kg/cm$^2$.

4. An electrically conductive hot press sintered ceramic product comprising from 20 to 50% by weight of boron nitride, from 35 to 79% by weight of titanium diboride and from 1 to 15% by weight of aluminum nitride, said ceramic product having a flexural strength of at least 900 kg/cm$^2$, a specific resistance of from 300 to less than 2,500 $\mu\Omega$cm, and a reduced anisotropy such that the ratio of the specific resistance in the hot-pressed direction to the specific resistance in the direction perpendicular to the hot-pressed direction is less than 1.4; and wherein said ceramic product is produced by hot press sintering a powder mixture comprising from 20 to 50% by weight of turbostratic boron nitride, from 35 to 79% by weight of titanium diboride and from 1 to 15% by weight of aluminum, aluminum nitride or a mixture thereof, under a non-oxidative atmosphere at a temperature of from 1,900° to 2,150° C. under a pressure of from 50 to 350 kg/cm$^2$.

5. A process for producing an electrically conductive ceramic product having a flexural strength of at least 900 kg/cm$^2$, a specific resistance of from 300 to less than 2,500 $\mu\Omega$cm and less anisotropy, such that the ratio of the specific resistance in the hot-pressed direction to the specific resistance in the direction perpendicular to the hot-pressed direction is less than 1.4; which comprises hot press sintering a powder mixture comprising from 20 to 50% by weight of turbostratic boron nitride, from 1 to 15% by weight of aluminum and/or aluminum nitride, the rest being titanium diboride, under a non-oxidative atmosphere at a temperature of from 1,900° to 2,150° C. under a pressure of from 50 to 350 kg/cm$^2$.

6. The process according to claim 5, wherein the powder mixture contains from 3 to 8% by weight of aluminum or from 5 to 12% by weight of aluminum nitride.

7. The process according to claim 5, wherein the powder mixture contains aluminum and aluminum nitride in a total amount of from 3 to 8% by weight as calculated as aluminum.

8. The process according to claim 5, wherein the non-oxidative atmosphere is under a vacuumed condition or at least one atmosphere selected from the group consisting of argon, nitrogen, carbon monoxide and hydrogen.

9. The process according to claim 5, wherein the ratio of the specific resistance in the hot-pressed direction to the specific resistance in the direction perpendicular to the hot-pressed direction is less than 1.2.

* * * * *